Jan. 26, 1971 R. M. PINCUS 3,559,066

HIGH ACCURACY PERIOD, FREQUENCY, INTERVAL AND EVENTS COUNTER

Filed April 1, 1968 5 Sheets-Sheet 1

INVENTOR.
RALPH M. PINCUS
BY [signature]
ATTORNEY

Jan. 26, 1971 R. M. PINCUS 3,559,066

HIGH ACCURACY PERIOD, FREQUENCY, INTERVAL AND EVENTS COUNTER

Filed April 1, 1968 5 Sheets-Sheet 2

INVENTOR
RALPH M. PINCUS
BY [signature]
ATTORNEY

INVENTOR.
RALPH M. PINCUS
BY [signature]
ATTORNEY

INVENTOR.
RALPH M. PINCUS
BY
ATTORNEY

INVENTOR.
RALPH M. PINCUS
BY
ATTORNEY

United States Patent Office 3,559,066

Patented Jan. 26, 1971

3,559,066

HIGH ACCURACY PERIOD, FREQUENCY, INTERVAL AND EVENTS COUNTER

Ralph M. Pincus, Paramus, N.J., assignor to The Bendix Corporation, a corporation of Delaware Filed Apr. 1, 1968, Ser. No. 717,545
Int. Cl. G04f *9/00;* G01r *23/02*
U.S. Cl. 324—186 18 Claims

ABSTRACT OF THE DISCLOSURE

A counter network for simultaneously measuring time functions and events and in which a control circuit controlled by a programmer enables an interval counter and an events counter to simultaneously make single counts, or repeated counts for a desired time period.

BACKGROUND OF THE INVENTION

Field of the invention

This invention relates to counter networks for measuring input parameters and, more particularly, to a counter network using integrated circuit elements for making single or repeated frequency, period, interval and events measurements.

Description of the prior art

Prior to the present invention counter networks had the capability of measuring only a single input parameter. By way of example, the device disclosed in U.S. Pat. No. 2,844,790, granted July 22, 1958 to T. W. Thomson et al. measures pulse intervals, and the device disclosed in U.S. Pat. No. 2,743,419, granted Apr. 24, 1956 to E. L. Chatterton et al. measures pulse frequency. Due to problems involving increased logic control circuitry and inherent programming delays, a single device, such as embodying the present invention for measuring a variety of parameters simultaneously has not heretofore been known.

SUMMARY OF THE INVENTION

The present invention contemplates a counter network for simultaneously measuring time functions and events in which a control circuit connects a time reference to an interval counter and a device to be tested to an events counter. A programmer provides signals to the control circuit to enable the interval counter and events counter to simultaneously make single counts or repeated counts for a desired time period. Delay means are connected to the control circuit for delaying counter operation at the beginning or end of each count to compensate for inherent delays in the control circuit.

One object of the invention is to provide counters for simultaneosuly counting time functions and events.

Another object of the invention is to delay operation of the counters at the beginning or end of each count to compensate for inherent delays in the control circuit and improve the accuracy of the count.

Another object of the invention is to provide a programmer for controlling the control circuit to enable the interval counter and events counter to simultaneously make single counts, or repeated counts, for a desired time period.

Another object of the invention is to provide different counting periods.

Another object of the invention is to control the duration of the counting period in response to events signals from the device being tested.

Another object of this invention is to provide means for making single count or repeated counts for a predetermined interval.

The foregoing and other objects and advantages of the invention will appear more fully hereinafter in consideration of the detailed description which follows and together with the accompanying drawings wherein several embodiments of the invention are illustrated. It is to be expressly understood, however, that the drawings are for illustration purposes only and are not to be construed as defining the limits of the invention.

DESCRIPTION OF THE DRAWINGS

In the drawings in which corresponding numerals indicate corresponding parts in the respective figures.

DESCRIPTION OF THE INVENTION

Figure 1:
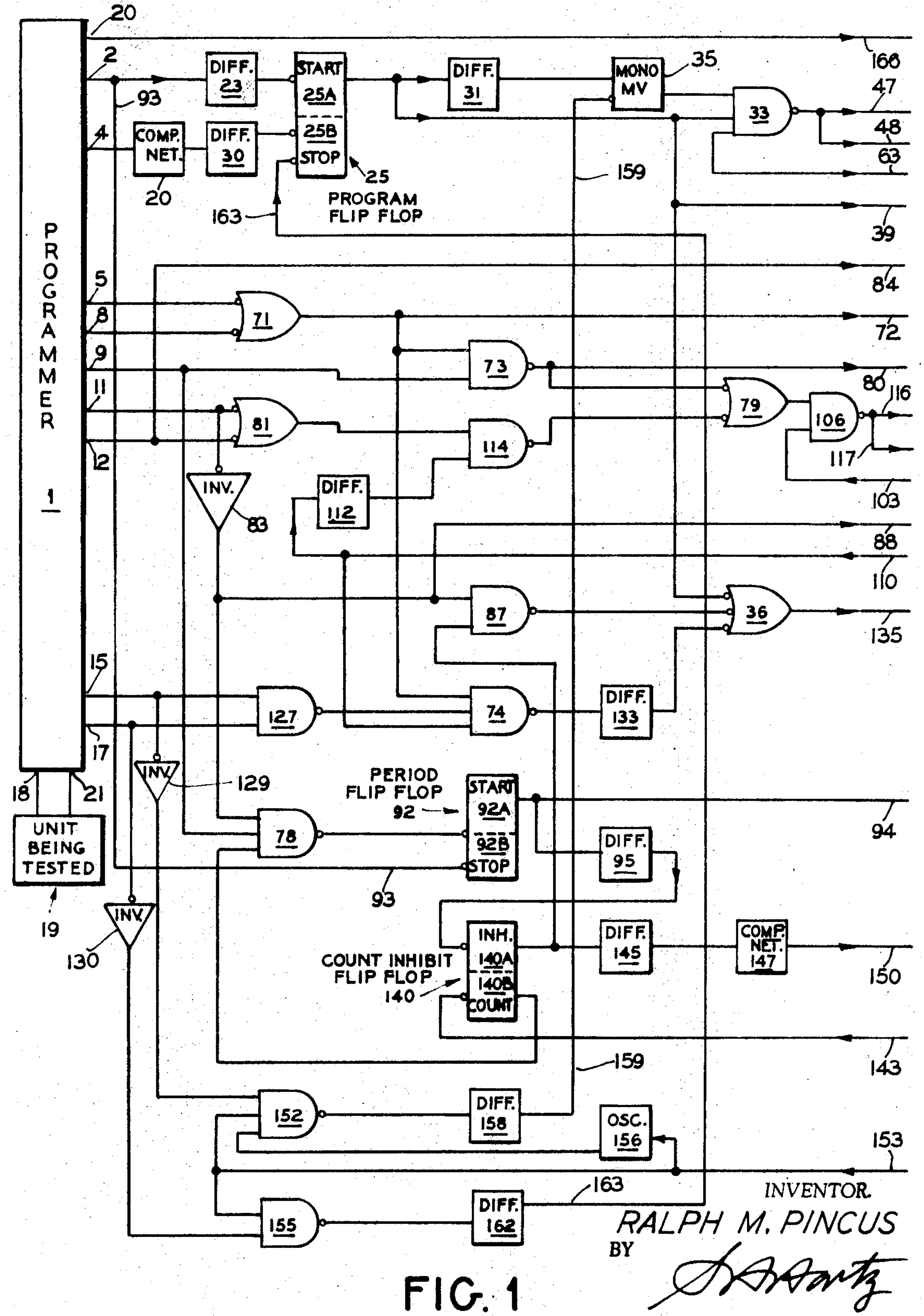
FIGS. 1 and 2 are block diagrams showing a novel counter network constructed according to the present invention.
Figure 2:
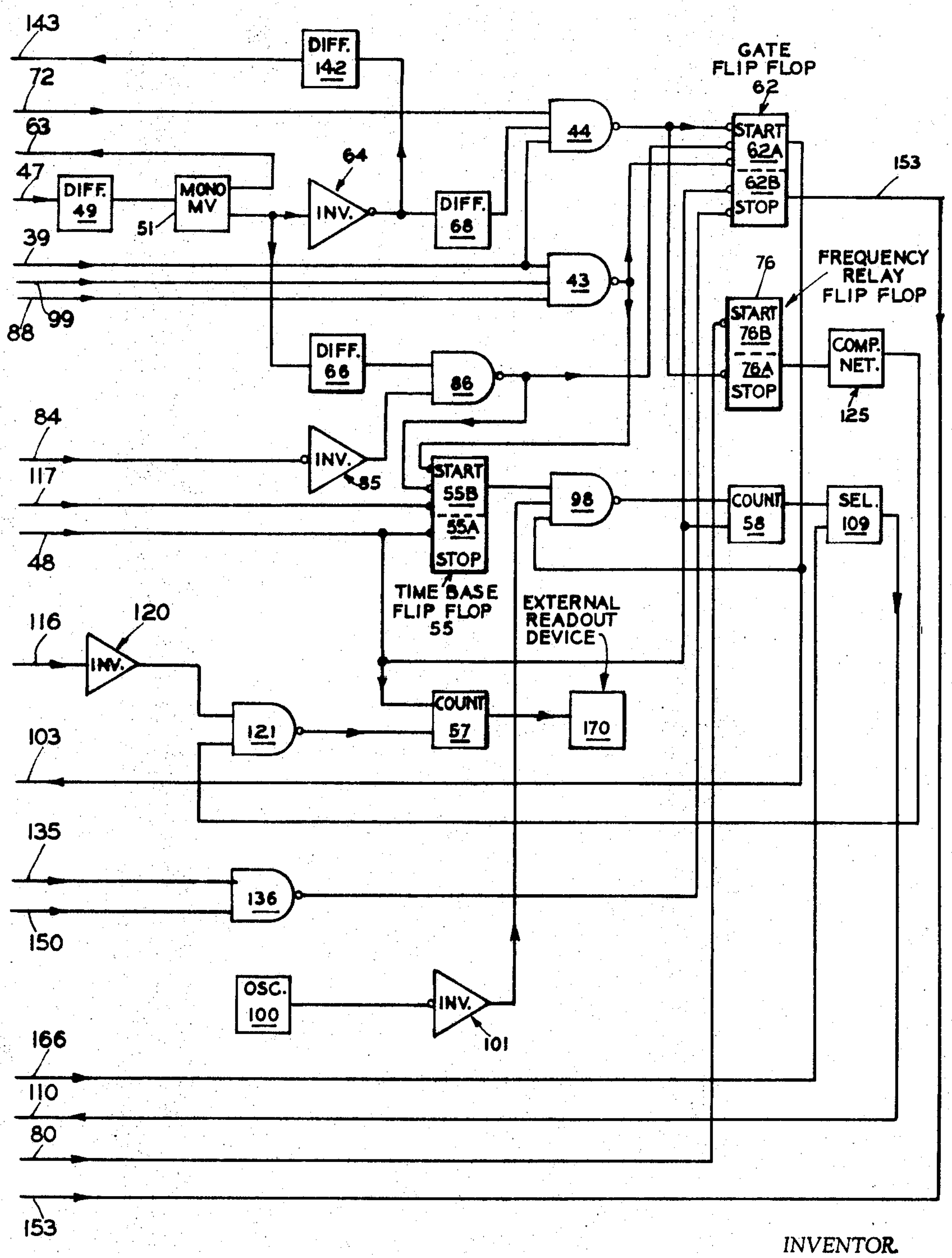

Referring to FIGS. 1 and 2 there is shown a programmer 1 having output terminals 2, 4, 5, 8, 9, 11, 12, 15, 17 and 20. Programmer 1 may be of a type similar to the AN/GSM-133 Checkout Sequence Programming Set manufactured by The Bendix Corporation for the U.S. Air Force and disclosed in Air Force technical manuals T.O. 33D2-41-27-1 and T.O. 33D2-41-27-4. Programmer 1 may be, for purposes of illustration, instrument test apparatus, which may be a general purpose programmer, by way of example, a AN/GSM-133 Programmer Comparator which may be purchased from the Bendix Corporation, and as such has internal power supplies and circuitry for providing appropriate signals at a terminal 18 to a device 19 being tested and for monitoring the response of device 19 by signals appearing at a terminal 21. Thus, a pulse output is provided at output terminal 9 indicative of the test being performed and if the device being tested is defective said pulse output may not occur. Additionally, since several different parameters may be tested as will hereinafter become evident, constant level direct current command outputs are provided at output terminals 5, 8, 11, 12, 15, 17 and 20, and which terminal 20 is indicative of ten similar terminals. Command pulses when required during operation will appear on output terminals 2 and 4.

A command "start" pulse at output terminal 2 of programmer 1 is applied to a differentiating circuit 23. Differentiating circuit 23 and all differentiating circuits hereinafter referred to unless otherwise specified may be of a conventional type such as that illustrated in figure 18-6(*b*), at page 621 of "Electronic and Radio Engineering," fourth edition, by Frederick E. Terman and published by the McGraw Hill Book Company (1955). The output from differentiating circuit 23 is applied to a "start" section 25A of a program flip-flop 25, and which flip-flop 25 has a "stop" section 25B. Flip-flop 25 and all flip-flops hereinafter referred to unless otherwise specified may be of a conventional type made by interconnecting an integrated circuit such as that manufactured by the Fairchild Semiconductor Company and carrying their designation Type 932 DT$\mu$L.

A command pulse at output terminal 4 of programmer 1 is applied to a program stop delay network 28. Program stop delay network 28 and all program stop delay networks hereinafter referred to unless otherwise specified may be of a conventional type monostable multivibrator made by the external connection of resistors and capacitors to an integrated circuit such as manufactured by the Fairchild Semiconductor Company and carrying their designation Type 914 μL. The output from delay network 28 is applied to a differentiating circuit 30 and therefrom to "stop" section 25B of program flip-flop 25.

The output from "start" section 25A of program flip-flop 25 is applied to a differentiating circuit 31 and to a first input of a three-input NAND gate 33. The output from differentiating circuit 31 is applied to a monostable multivibrator 35 and therefrom to a second input of NAND gate 33. The output from the "start" section of flip-flop 25 is applied to a first input of a three-input NOR gate 36 and is applied through a conductor 39 to a first input of a three-input NAND gate 43 and to a first input of a three-input NAND gate 44, and which gates 43 and 44 are shown in the block diagram of FIG. 2.

The output from NAND gate 33 is applied through a conductor 47 to a differentiating circuit 49 and therefrom to a monostable multivibrator 51. The output from NAND gate 33 is applied through a conductor 48 to a "stop" section 55A of a flip-flop 55 having a "start" section 55B; to an input of an events counter 57 shown in FIG. 2, and which counter 57 may be of a ten decade type with one decade having four flip-flops such as manufactured by the Fairchild Semiconductor Company and carrying their designation Type 948 DTμL and nine decade counters of the type manufactured by the Fairchild Semiconductor Company and carrying their designation Type 958 CμL; to an input of an interval counter 58, and which counter 58 has one less decade than counter 57; and to a "stop" section 62B of a flip-flop 62 having a "start" section 62A.

The output from monostable multivibrator 51 is applied through a conductor 63 to a third input of three-input NAND gate 33. The output from monostable multivibrator 51 is applied to an inverter 64 and to a differentiating circuit 66. The output from inverter 64 is applied to a differentiating circuit 68 and therefrom to a second input of three-input NAND gate 44.

The direct current command output at output terminal 5 of programmer 1 is applied to a first input of a two-input NOR gate 71. The direct current output at output terminal 8 of programmer 1 is applied to a second input of NOR gate 71. The output from NOR gate 71 is applied to a first input of a two-input NAND gate 73 and to a first input of a three-input NAND gate 74. The output from NOR gate 71 is applied through a conductor 72 to a third input of three-input NAND gate 44. The output from NAND gate 44 is applied to a "start" section 62A of flip-flop 62 and to a "stop" section 76A of a frequency delay flip-flop 76 having a start section 76B. The pulse output at output terminal 9 of programmer 1, and which output corresponds to a selected test to be performed as heretofore noted, is applied to the second input of two-input NAND gate 73 and to a first input of a three-input NAND gate 78. The output of NAND gate 73 is applied to a first input of a two-input NOR gate 79 and is applied through a conductor 80 to "start" section 76B of frequency delay flip-flop 76.

The direct current command output at output terminal 11 of programmer 1 is applied to a first input of a two-input NOR gate 81 and is applied to an inverter 83. The direct current command output at output terminal 12 of programmer 1 is applied to a second input of NOR gate 81. The output from inverter 83 is applied to a first input of a two-input NAND gate 87 and to a second input of three-input NAND gate 78. The output from inverter 83 is applied through a conductor 88 to a second input of three-input NAND gate 43 shown in FIG. 2. The output of NAND gate 43 is applied to "start" section 62A of flip-flop 62 and to "start" section 55B of flip-flop 55.

The D.C. command output at output terminal 12 is applied through a conductor 84 to an inverter 85 shown in FIG. 2 and the output from inverter 85 is applied to a first input of a two-input NAND gate 86. The output from differentiating circuit 66 (FIG. 2) is applied to the second input of NAND gate 86, and the output of NAND gate 86 is applied to "start" section 62A of flip-flop 62 and to "start" section 55B of flip-flop 55.

The output from NAND gate 78 is applied to a toggle input of a period flip-flop 92 having a "start" section 92A and a "stop" input 92B. The command pulse output from output terminal 2 of programmer 1 is applied through a conductor 93 to "stop" section 92B of period flip-flop 92. The output from "start" section 92A of period flip-flop 92 is applied to a differentiating circuit 95, and is applied through a conductor 94 to the third input of NAND gate 43 shown in FIG. 2.

The output from "start" section 55B of flip-flop 55 (FIG. 2) is connected to a first input of a three-input NAND gate 98. A signal from an oscillator 100 is applied to an inverter 101 and the output of inverter 101 is applied to a second input of three-input NAND gate 98. The output from start section 62A of flip-flop 62 is applied to a third input of three-input NAND gate 98 and is applied through a conductor 103 to a first input of a two-input NAND gate 106 (FIG. 1). The output from NAND gate 98 is applied to interval counter 58.

Time related outputs from the interval counter 58 are applied to a time base selector 109 shown in FIG. 2, and which selector 109 is essentially ten two-input AND gates for selecting one time related output of the interval counter. The selected output from selector 109 is applied through a conductor 110 to a differentiating circuit 112 and to a second input of three-input NAND gate 74.

The output from differentiating circuit 112 is applied to a first input of a two-input NAND gate 114 and the output of NOR gate 81 is applied to the second input of NAND gate 114.

The output of the NAND gate 114 is applied to a second input of NOR gate 79 and the output of NOR gate 79 is applied to the second input of NAND gate 106. The output of NAND gate 106 is applied through a conductor 116 to an inverter 120 and through a conductor 117 to "start" section 55B of time base flip-flop 55. The output from inverter 120 is applied to the first input of a two-input NAND gate 121.

The output from "stop" section 76A of frequency delay flip-flop 76 is also applied to a frequency delay compensation network 125 shown in FIG. 2 and which frequency delay network 125 may be of a type similar to the aforementioned program stop delay network 28. The output from frequency delay compensation network 125 is applied to the second input of NAND gate 121 and the output from NAND gate 121 is connected to events counter 57.

The direct current command output at output terminal 15 of programmer 1 is applied to a first input of a two-input NAND gate 127 and is applied to an inverter 129. The direct current command output at output terminal 17 of programmer 1 is applied to a second input of NAND gate 127 and is applied to an inverter 130. The output from NAND gate 127 is applied to a third input of three-input NAND gate 74. The output from NAND gate 74 is applied to a differentiating circuit 133 and therefrom to the second input of three-input NOR gate 36. The output from NAND gate 87 is connected to the third input of NOR gate 36 and which NOR gate 36 provides an output which is applied through a conductor 135 to a first input of a two-input NAND gate 136 shown in FIG. 2

The output from differentiating circuit 95 is applied to the inhibit section 140A of a count/inhibit flip-flop 140. The output from inverter 64 is applied to a differentiating circuit 142 and therefrom through a conductor 143 to an input of the count section 140B of count/inhibit flip-flop 140. The output of the count section 140B of flip-flop 140 is applied to the third input of three-input NAND gate 78, and the output from the inhibit section 140A of flip-flop 140 is applied to the second input of two-input NAND gate 87 and to a differentiating circuit 145. The output from differentiating circuit 145 is applied to a period delay compensation network 147, which may be of a type similar to the aforementioned program stop delay compensation network 28. The output from compensation network 147 is applied through a conductor 150 to the second input of the two-input NAND gate 136 shown generally in FIG. 2. The output of NAND gate 136 is applied to the stop section 62B of the flip-flop 62 shown in FIG. 2

The output of inverter 129 is applied to a first input of a three-input NAND gate 152. The output from the "stop" section 62B of flip-flop 62 is applied through a conductor 153 to a second input of NAND gate 152, to a first input of a two-input NAND gate 155 and to an oscillator 156. The output from oscillator 156 is applied to the third input of three-input NAND gate 152. The output of NAND gate 152 is applied to a differentiating circuit 158 and therefrom through a conductor 159 to an input of monostable multivibrator 35.

The output from inverter 130 is connected to the second input of two-input NAND gate 155 and the output from NAND gate 155 is connected to differentiating circuit 162. The output from differentiating circuit 162 is applied through a conductor 163 which is connected to the stop section 25B of program flip-flop 25.

The direct current output at output terminal 20, representing ten terminals, of programmer 1 is applied to a conductor 166 and which conductor 166 represents ten conductors each of which is connected to a corresponding input of the ten AND gates in time base selector 109.

The output from counter 57 is connected to an external readout device 170.

OPERATION

Repeated measurement of frequency or of events

Referring to FIGS. 1 and 2, when the frequency mode of operation, repeated measurement, is manually or automatically selected, low logic level D.C. voltages appear at output terminals 2, 4, 5, 15, and 20 and high logic level D.C. voltages appear at output terminals 8, 11, 12 and 17 of programmer 1. A voltage at a predetermined level indicative of the selected mode of operation is provided at output terminal 9.

When the events mode of operation, repeated measurement, is manually or automatically selected, a low logic level D.C. voltage appears at terminal 8 and a high logic level D.C. voltage appears at terminal 5. Terminals 2, 4, 9, 11, 12, 15 and 17 are at the same levels as indicated for frequency mode, repeated measurement. The voltages at terminals 5, 8, 11, 12, 15 and 17 remain constant for the frequency or events modes of operation, repeated measurement, while voltages on terminals 2, 4 and 9 will vary as hereinafter described.

The high level D.C. voltages at terminals 11 and 12 are applied to the NOR gate 81 which blocks the voltages and provides a low level D.C. voltage for disabling NAND gate 114.

The low level D.C. voltage at terminal 5 is inverted by NOR gate 71 and which NOR gate 71 thereupon applies a high level D.C. voltage to NAND gate 73 to enable said gate, to NAND gate 44, and to NAND gate 74. NOR gate 71 provides for operation in either the frequency or events modes.

The events signals indicative of the selected mode of operation at terminal 9 is inverted and passed by NAND gate 73. NAND gate 73 controls the passage of the events signals to NOR gate 79, and to flip-flop 76 for triggering flip-flop 76 to its "start" condition. The events signals at terminal 9 are also applied to NAND gate 78. However, NAND gate 78 is disabled by the low level D.C. voltage applied from inverter 83 resulting from the inversion of the high level D.C. voltage appearing at the terminal 11. NAND gate 78 controls the counting, by counter 58, of the timing pulses provided by oscillator 100 as a function of the events signal at terminal 9 and a count command from flip-flop 140 as will be hereinafter explained.

NOR gate 79 causes the events signals or the selected time related output from time base selector 109 to be applied to NAND gate 106; however, only the events signals are provided at NOR gate 79 in the frequency mode.

Figure 3:
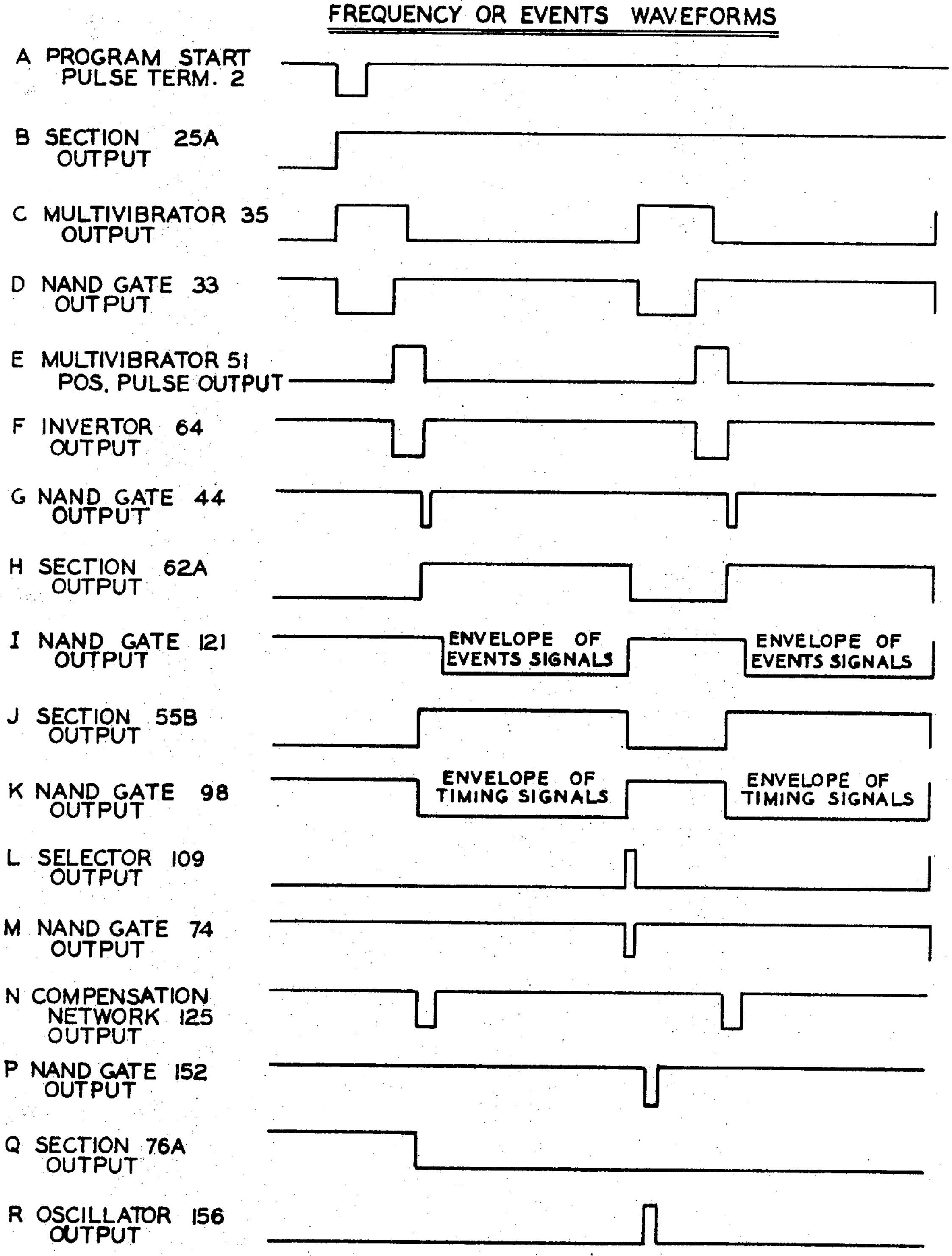
FIG. 3 is a diagrammatic representation showing pulse wave forms provided at various stages of operation when the device of the present invention is measuring frequency or events.
Figure 5:
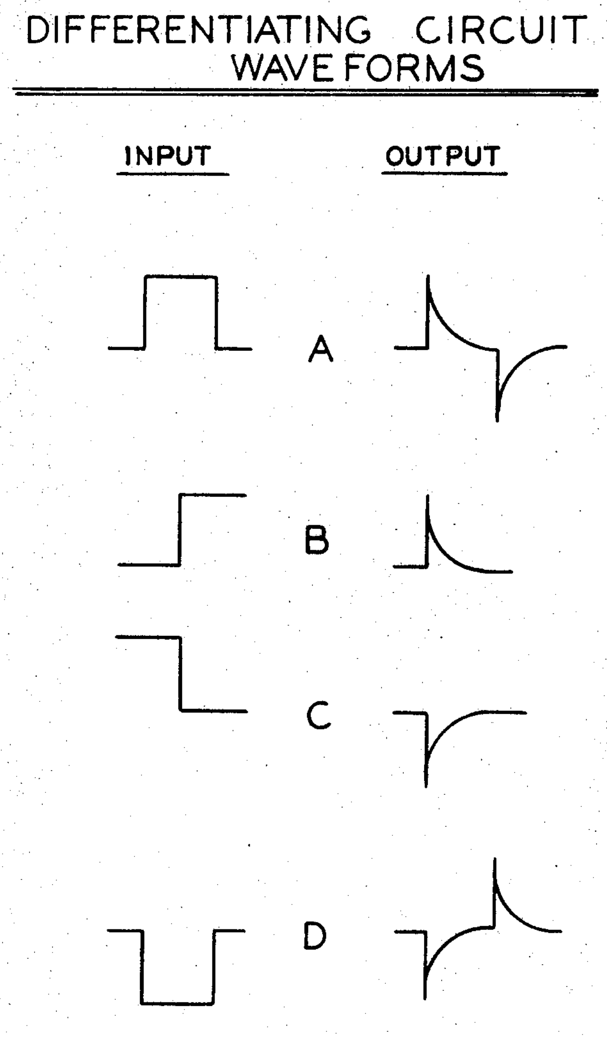
FIG. 5 is a diagrammatic representation showing pulse wave form inputs to a typical differentiating circuit and the resultant output wave forms in accordance with the present invention.

A program start negative pulse is applied from terminal 2 to differentiating circuit 23 as shown in FIG. 3A. It should be noted that when a square wave pulse is applied to a differentiating circuit, the differentiating circuit will yield a negative spike and a positive spike, as shown in FIGS. 5A and 5D. A differentiating circuit will yield one spike pulse, as shown in FIGS. 5B and 5C, for a change in D.C. voltage level.

The negative spike pulse and the positive spike pulse are applied from differentiating circuit 23 to an input of start section 25A of flip-flop 25 causing section 25A to provide a high level D.C. voltage output as shown in FIG. 3B. This output is a control voltage that partially enables NAND gates 33, 43 and 44, and causes monostable multivibrator 35 to provide a positive pulse as shown in FIG. 3C.

Monostable multivibrator 51 shown in FIG. 2 is in a quiescent condition and provides a high level D.C. voltage which is applied to NAND gate 33. Thus, the high level D.C. output from multivibrator 51, the high level D.C. output from start section 25A of flip-flop 25 and the positive pulse from multivibrator 35 cause NAND gate 33 to provide a negative pulse output as shown in FIG. 3D. NAND gate 33 permits the output from multivibrator 51 to shape the pulse from multivibrator 35 and NAND gate 33 provides a reset pulse to reset flip-flop 55, counter 57, counter 58 and flip-flop 62.

Differentiating circuit 49 shown in FIG. 2 yields a positive spike pulse and a negative spike pulse, as shown in FIG. 5D, in response to the negative pulse output from NAND gate 33, and which spike pulses are applied to multivibrator 51 causing said multivibrator to generate a positive pulse output, as shown in FIG. 3E, and a negative pulse output. The negative pulse from monostable multivibrator 51 is fed back to NAND gate 33 and delays the pulse from multivibrator 35 so as to sharpen the output pulse from NAND gate 33 by terminating said pulse.

The positive pulse output provided by monostable multivibrator 51 is applied to inverter 64. The inverted pulse, as shown in FIG. 3F, is applied to differentiating circuit 68. The resulting positive spike pulse is applied to NAND gate 44. The output of NAND gate 44 controls flip-flops 62 and 76, and which NAND gate 44 is enabled by outputs from start section 25A of flip-flop 25 and NOR gate 71. NAND gate 44, upon application of the positive spike pulse, provides a negative pulse output, as shown in FIG. 3G, which is applied to start section 62A of flip-flop 62 causing start section 62A to provide a high level D.C. output, as shown in FIG. 3H.

Start section 62A of flip-flop 62 provides a control voltage which enables NAND gates 98 and 106. NAND gate 106, in the frequency or events mode of operation, controls the passage of the events signals from terminal 9 to NAND gate 121, and also controls the utilization of the events signals to trigger flip-flop 55 to its start condition. The application of the inverted events signals from NAND gate 106 to the start section 55B of flip-flop 55 causes start section 55B to provide a high level D.C. voltage output as shown in FIG. 3J.

The output from stop section 76A of flip-flop 76, when triggered by the inverted events signals output from NAND gate 73, is a low level D.C. voltage as shown in FIG. 3Q. The change in level of the output of section 76A triggers compensation network 125. Compensation network 125, whose quiescent output is a high level D.C. voltage, generates a negative pulse for temporarily disabling NAND gate 121 as shown in FIG. 3N.

The inverted events signals from NAND gate 106 are applied to inverter 120. The output from inverter 120 is the events signals, and which signals are applied to NAND gate 121 which is disabled by the negative pulse from compensation network 125. NAND gate 121 controls the passage of the events signals to counter 57.

Once the disabling negative pulse from compensation network 125 has passed, the events signals from inverter 120 passes and are inverted by NAND gate 121. The envelope of the events signals passing through NAND gate 121 is shown in FIG. 3I. The inverted events signals are applied from NAND gate 121 to counter 57. Counter 57 continues to count the pulses from the termination of the disabling pulse from network 125 until the time the output of the time base selector 109 triggers flip-flop 62 to a "stop" condition explained hereinafter.

The high level D.C. output voltages from the start sections 55B and 62A of flip-flops 55 and 62, respectively, enables NAND gate 98. NAND gate 98 controls the passage of the timing signal from oscillator 100 to counter 58. The timing signal from the oscillator 100 is inverted by inverter 101 and the inverted signal is applied to NAND gate 98. Since the NAND gate 98 is enabled, the inverted timing signal is inverted again and passes through NAND gate 98 to counter 58. FIG. 3K shows the envelope of the timing signal passing through NAND gate 98.

Counter 58 counts time as a function of the timing signal and divides the timing signal into signals of lower frequencies. The timing signal and the signals of lower frequency are individually applied to NAND gates included in selector 109. One of the NAND gates is enabled by a high level D.C. voltage from control source 1 applied through one of the ten conductors represented by conductor 166. Selector 109 has a time related output which is the timing signal or a signal of a lesser frequency. The function of counter 58 in conjunction with selector 109 in the frequency or events mode of operation is to provide a particular time interval. The time interval so provided occurs as a function of pulses in the selected signal from counter 58. The first pulse in the output signal from selector 109, as shown in FIG. 3L and which terminates the time interval, is applied to one input of the three-input NAND gate 74 through conductor 110. NAND gate 74 inverts the pulse and passes the pulse if a frequency measurement or events measurement command appears at terminal 5 or 8, respectively, and if a repeated measurement command or single measurement command, but not both, appears at terminals 15 and 17, respectively, as hereinafter explained. Since either a frequency or events measurement command is present at terminal 5 or 8, respectively, NAND gate 74 is partially enabled by the high level D.C. voltage output from NOR gate 71. The low level D.C. voltage at terminal 15, and which voltage is a repeated measurement command, is applied to NAND gate 127. NAND gate 127 acts as a safety device to prevent a repeated measurement command and a single measurement command from entering the counter network simultaneously. When NAND gate 127 is disabled, the gate provides a high level D.C. output which is applied to NAND gate 74 thereby fully enabling NAND gate 74. The pulse from selector 109 is inverted and passes through NAND gate 74, as shown in FIG. 3M, and is applied to differentiating circuit 133, and which differentiating circuit 133 provides negative and positive spike pulses. These spike pulses are applied to one input of the three-input NOR gate 36. NOR gate 36 permits a low level D.C. voltage output from section 25A of flip-flop 25 or from section 140A of flip-flop 140, or a negative pulse resulting from the output of selector 109 to be applied to NAND gate 136. The negative pulse from NOR gate 36 is inverted and applied to the NAND gate 136, and which gate controls the triggering of the stop section 62B of flip-flop 62 as a function of the output of compensation circuit 147 and the output from NOR gate 36 NAND gate 136 is enabled by the high level D.C. voltage provided when compensation network 147 is in the quiescent state. NAND gate 136 yields a negative pulse in response to the positive spike pulse from NOR gate 36. The negative pulse is applied to the "stop" section 62B of flip-flop 62, triggering flip-flop 62 to the "stop" condition thereby causing the high level D.C. voltage applied to AND gate 106 by flip-flop 62 to go to a low level D.C. voltage, thus disabling NAND gate 106.

With NAND gate 106 disabled, the events signals from the device being tested is prevented from entering counter 57. Counter 57 now contains the number of events signals occuring during the time period starting with the termination of the disabling pulse from network 125 being applied to NAND gate 106 and terminating with the triggering of flip-flop 62 to its "stop" condition causing the output of section 62A to go to a low logic level thereby disabling NAND gate 106. The count provided by counter 57 is delayed in readout device 170.

At the time flip-flop 62 is triggered to its "stop" condition, a high level D.C. voltage output from "stop" condition 62B of flip-flop 62 is applied to NAND gate 152 partially enabling said gate. NAND gate 152 controls the application of the output from oscillator 156 as a function of the output of section 62B of flip-flop 62 and the repeated measurement command. NAND gate 155 is disabled by the low level D.C. voltage output from inverter 130 caused by the presence of a high level D.C. voltage at terminal 17. The low level D.C. voltage present at terminal 15 is inverted by inverter 129 and is applied to NAND gate 152 along with the output voltage from section 62B of flip-flop 62 fully enabling gate 152.

The voltage output from section 62B of flip-flop 62 causes oscillator 156 to generate a pulse, as shown in FIG. 3R, delayed from the time flip-flop 62 was triggered into "stop" condition, and which pulse is applied to the enabled NAND gate 152. The procedure is repeated for subsequent pulses generated by oscillator 156.

The NAND gate 152 inverts and passes the pulses from oscillator 156, as shown in FIG. 3P, and applies them to the differentiating circuit 158. The negative spike pulse from circuit 158 triggers multivibrator 35 which again produces the positive pulse which starts the sequence of operation over again.

The repeated measurement mode of operation is terminated by the application of a negative "stop" pulse by the programmer 1 to the delay compensation network 28 which generates a positive pulse. The negative spike pulse output of differentiating circuit 30, refer to FIG. 5A, triggers flip-flop 25 to its stop condition. The output of section 25A of flip-flop 25 goes to a low level D.C. voltage thereby disabling NAND gates 33, 43 and 44. The delay in triggering flip-flop 25 achieved by compensation network 28 is accomplished by the width of the pulse, emanating from compensation network 28, during the differentiating of the pulse by circuit 30. Since the negative spike pulse is the second pulse out of circuit 30, it may be delayed in time by increasing the width of the pulse from compensation network 28.

Single measurement of frequency or events

The single measurement of frequency or events mode of operation is similar to that of the repeated measurement mode heretofore described except that a low logic level D.C. voltage, single measurement command, appears at terminal 17 of the programmer 1 while a high level D.C. voltage appears at terminal 15. NAND gate 127 is disabled by the low level D.C. voltage on terminal 17. Inverter 130 inverts the low level D.C. voltage, single measurement command, on terminal 17 to a high level D.C. voltage which enables NAND gate 155. Inverter 129 inverts the high level D.C. voltage at terminal 15 to a low level D.C. voltage which is applied to NAND gate 152 thereby disabling said gate. As the process of counting events signals continues as for the repeated measurement mode of operation, for the single measurement mode NAND gate 152 is disabled and prevents pulses from oscillator 156 from triggering multivibrator 35 and thereby prevents restarting the count cycle.

The high level D.C. voltages from the output of section 62B of flip-flop 62, and from the output of inverter 130 cause the output from NAND gate 155 to go from a high logic level to a low logic level. NAND gate 155 provides a change in voltage level for triggering flip-flop 25 to a "stop" condition. The change from a high logic level to a low logic level D.C. voltage causes differentiating circuit 162 to yield a negative spike pulse, as shown in FIG. 5C. The negative spike pulse is applied to the stop section 25B of flip-flop 25 causing the high logic level voltage at start section 25A to go to a low logic level thereby disabling the NAND gates 33, 43 and 44.

Repeated measurement of time interval

Referring to FIGS. 1 and 2, when the time interval mode of operation, repeated measurement, is manually or automatically selected, low logic level voltages are provided at output terminals 2, 4, 11, 15 and 20 and high logic level D.C. voltages are provided at output terminals 5, 8, 12 and 17 of programmer 1. A voltage at a predetermined level indicative of the time interval measurement is provided at output terminal 9. The voltages on terminals 5, 8, 11, 12, 15 and 17 will remain constant for the time interval mode of operation, repeated measurement, while voltages on the terminals 2, 4, 9 and 20 will vary as hereinafter described.

Figure 4:
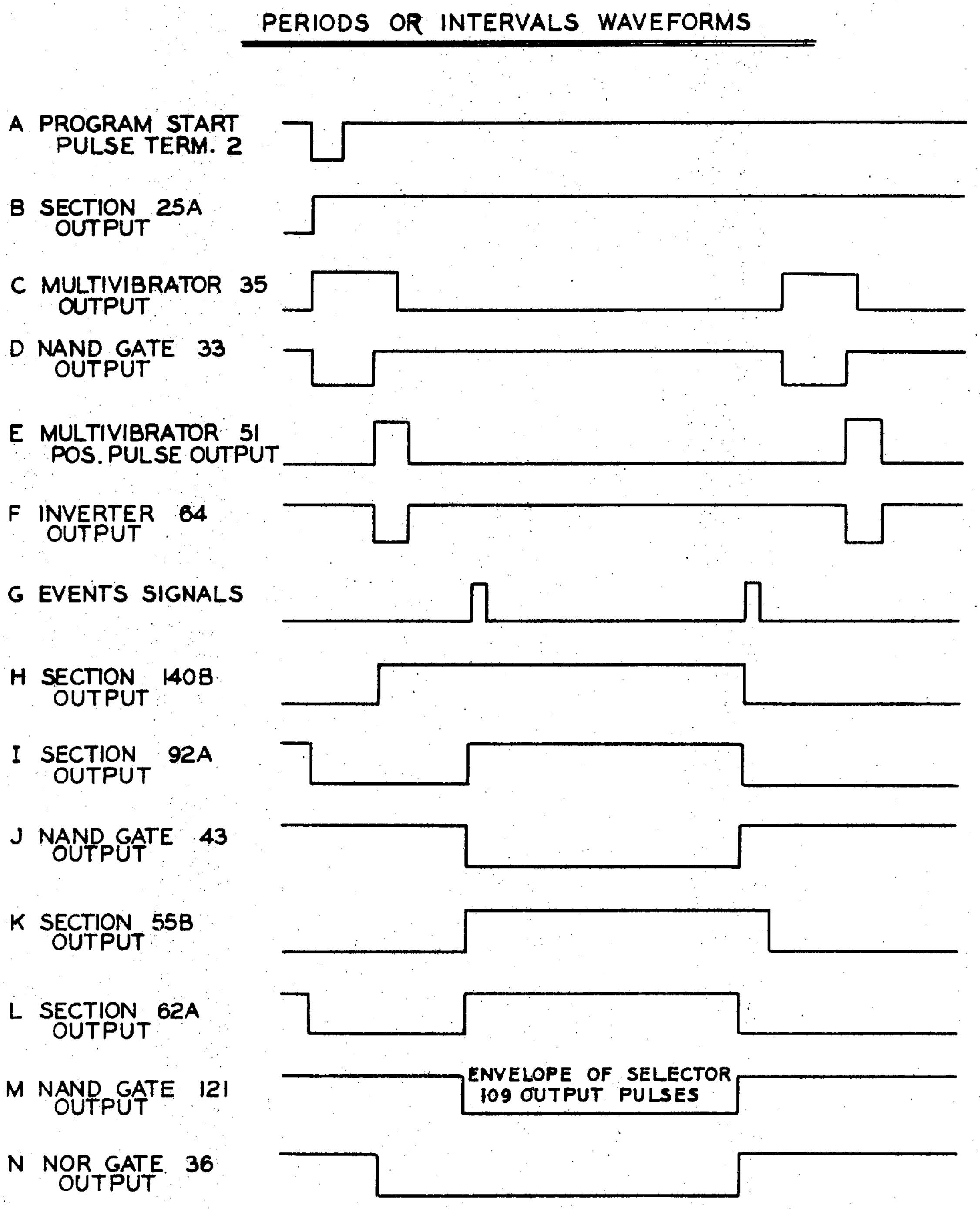
FIG. 4 is a diagrammatic representation showing pulse wave forms provided at various stages of operation when the device of the present invention is measuring periods or intervals.

A negative program start pulse appearing at output terminal 2 of programmer 1, as shown in FIG. 4A, is applied to differentiating circuit 23. The negative spike pulse and the positive spike pulse provided by differentiating circuit 23 are applied to start section 25A of flip-flop 25 causing said start section to have a high level D.C. voltage output, as shown in FIG. 4B. Start section 25A provides a control voltage that partially enables NAND gates 33, 43 and 44, and causes monostable multivibrator 35 to generate a positive pulse, as shown in FIG. 4C. The positive pulse output from multivibrator 35 is applied to NAND gate 33.

The enabling of NAND gate 33 is accomplished by the high logic level D.C. voltages from monostable multivibrator 51 and the output from start section 25A of the flip-flop 25. Thus, the positive pulse is inverted and passed through NAND gate 33. The output from NAND gate 33, as shown in FIG. 4D, is also a reset pulse used to reset flip-flops 55 and 62 and counters 57 and 58. The negative output pulse from NAND gate 33 is also applied to differentiating circuit 49 which provides a positive spike pulse and a negative spike pulse and which positive and negative pulses are applied to monostable multivibrator 51. Multivibrator 51 generates a negative pulse which disables NAND gate 33 thus sharpening the pulse passing through the NAND gate 33.

Monostable multivibrator 51 also generates a positive pulse, as shown in FIG. 4E, which is applied to inverter 64. The output of inverter 64, which is shown in FIG. 4F, is applied to differentiating circuit 142. The positive spike pulse and the negative spike pulse are applied to the count section 140B of flip-flop 140, causing the count section 140B to provide a high level D.C. voltage output, as shown in FIG. 4H. The output from count section 140B controls NAND gate 78, while inhibit section 140A of flip-flop 140 output triggers the period delay compensation network 147.

The high level D.C. voltage from section 140B of flip-flop 140 is applied to NAND gate 78 to partially enable said gate. The low level D.C. voltage at terminal 11 of programmer 1 is inverted to a high level D.C. voltage by inverter 83 and applied to the NAND gate 78 along with the output of section 140B of flip-flop 140 to fully enable said NAND gate. NAND gate 78 inverts and passes the events signals, as shown in FIG. 4G, appearing at output terminal 9 of programmer 1.

The output from NAND gate 78 is inverted events signals and are applied to the toggle input of flip-flop 92, and which flip-flop 92 was initially in the stop condition caused by the application of the negative program start pulse from terminal 2, as shown by FIG. 4I. The application of a negative pulse, first events signals, to the toggle input of flip-flop 92 causes flip-flop 92 to change state which in this instance is a change to the start condition. Start section 92A of flip-flop 92 provides a control voltage for NAND gate 43. A high level D.C. voltage output from start section 92A of flip-flop 92, as shown by FIG. 4I, is applied to NAND gate 43 and to differentiating circuit 95. Differentiating circuit 95 applies a positive spike pulse, as a result of the output from start section 92A changing from a low level to a high level, to inhibit section 140A of flip-flop 140. However, the output from differentiating circuit 95 is a positive spike pulse, as shown in FIG. 5B, and it *does not* trigger flip-flop 140 and said flip-flop remains in the "count" condition.

NAND gate 43 has been previously enabled by the application of high level D.C. voltages from start section 25A of flip-flop 25 and from inverter 83 so that the output of section 92A of flip-flop 92 causes NAND gate 43 to provide a low level D.C. voltage output as shown in FIG. 4J. NAND gate 43 thus provides a control voltage for triggering flip-flops 55 and 62 to their "start" condition. The high level D.C. voltage output from the inverter 83 is provided in response to the low level D.C. voltage appearing at terminal 11 of the programmer 1. NAND gate 43 applies a low level D.C. voltage to start section 55B and 62A of flip-flops 55 and 62, respectively, causing those sections to have high level D.C. voltage outputs, as shown by FIGS. 4K and 4L.

The high level D.C. voltage output from section 62A of flip-flop 62 is applied to NAND gate 98 and to NAND gate 106, fully enabling NAND gate 106. The high level D.C. voltage output from section 55B of flip-flop 55 is applied to NAND gate 98 along with the voltage from flip-flop 62 to fully enable NAND gate 98 so that the timing signal from oscillator 100, inverted by the inverter 101, passes through NAND gate 98 into counter 58. Counter 58 outputs are applied to selector 109 as heretofore explained.

The time related output of counter 58, as selected through selector 109, is applied to differentiating circuit 112. The differentiated output of circuit 112 is applied to NAND gate 114. NAND gate 114 controls the passage of the selected output from counter 58 into counter 57 as a function of either a time interval measurement command, present at terminal 11, or a time measurement command, present at terminal 12 of programmer 1.

NAND gate 114 is enabled by the high level D.C. voltage output of NOR gate 81 caused by the presence of a low level D.C. voltage, time interval measurement command, at terminal 11. The selected output from counter 58 is inverted and passed through NAND gate 114 and is applied to NOR gate 79. NOR gate 79 functions to apply either events signals or a selected output signal from selector 109 to NAND gate 106. NOR gate 79 restores the selected output signal from selector 109 to its original polarity and applies the signal to NAND gate 106 which was enabled by the high level D.C. voltage from section 62A of flip-flop 62. The selected output signal from selector 109 is inverted and passes through NAND gate 106. NAND gate 106 controls the entry of signals into counter 57 as a function of the output of flip-flop 62 in response to the initial start pulse.

The inverted selector 109 output is applied to the inverter 120 and to start section 55B of flip-flop 55. The inverter 120 restores the output from selector 109 to its original polarity and applies said output to NAND gate 121. NAND gate 121 delays the application of signals to counter 57 when the device of the invention is operating in the frequency or events modes. Since frequency delay compensation network 125 has not been triggered, it has a high level D.C. voltage output which enables NAND gate 121. The output signal from selector 109 is inverted and passes through NAND gate 121 to counter 57. FIG. 4M shows the output of NAND gate 121 as an envelope of the pulses which comprises the selector 109 output.

When the second events signal appears at terminal 9 of programmer 1, it is applied to NAND gate 78. NAND gate 78 has been enabled by the high level D.C. voltages from section 140B of flip-flop 140 and from inverter 83, as heretofore explained, so that the second events signal is inverted and passes through NAND gate 78 and is applied to the toggle input of flip-flop 92. The inverted second events signal triggers flip-flop 92 to its "stop" condition causing the D.C. voltage from section 92A to go from a high level to a low level. Differentiating circuit 95 yields a negative spike pulse in response to the change in output level from section 92A of flip-flop 92. The negative spike pulse is aplied to inhibit section 140A of flip-flop 140 causing the inhibit section to have a high level D.C. voltage.

The output from section 140A of flip-flop 140 is applied to differentiating circuit 145 and which circuit 145 yields a positive spike pulse. The positive spike pulse is applied to compensaton network 147 causing it to generate a disabling negative pulse which is applied to NAND gate 136. The negative pulse disables NAND gate 136 for the duration of the pulse.

The high level D.C. voltage output from section 140A of flip-flop 140 is also applied to NAND gate 87 which had been previously enabled by inversion of the low level D.C. voltage, measurement of time interval command, at terminal 11. NAND gate 87 controls the high level D.C. voltage from the inhibit section 140A of flip-flop 140 as a function of the time interval measurement command. NAND gate 87 applies a low level D.C. voltage to NOR gate 36. NOR gate 36 inverts the low level D.C. voltage, as shown in FIG. 4N, and applies the high level D.C. voltage to NAND gate 136. However, as heretofore explained, NAND gate 136 is disabled by the delay pulse provided by compensation network 147 for the time duration of the delay pulse. Upon the termination of the delay pulse, the NAND gate 136 is enabled thereby permitting the high level D.C. voltage, to be inverted and passed. The low level D.C. voltage output from NAND gate 136 is used to trigger flip-flop 62 to its "stop" condition.

With flip-flop 62 in its "stop" condition, the output from section 62A, and which output is a high level D.C. voltage, goes to a low level D.C. voltage thereby disabling NAND gate 106. Disabled NAND gate 106 prevents the selected output signal from selector 109 from entering counter 57. The output from section 62B of flip-flop 62 goes to a high level D.C. voltage and is applied to oscillator 156, to NAND gate 152 and to NAND gate 155. Oscillator 156 provides delayed output pulses in response to the output voltage from section 62B. NAND gate 155 is disabled by the low level D.C. voltage output from inverter 130 caused by the high level D.C. voltage appearing on terminal 17. NAND gate 152 is enabled by the high level D.C. voltage from inverter 129, which inverted the low level D.C. voltage present at terminal 15 of programmer 1, and from section 62B of flip-flop 62. The pulses from oscillator 156 are inverted and permitted to pass through the enabled NAND gate 152 and are applied to differentiating circuit 158. The spike pulses from differentiating circuit 158 trigger monostable multivibrator 35 which again provides a positive pulse to trigger a repeat measurement of time interval.

The repeated measurement mode of operation is terminated by the application of a negative "stop" pulse by the programmer 1 to the delay compensation network 28 which generates a positive pulse. The negative spike pulse output of differentiating circuit 30, refer to FIG. 5A, triggers flip-flop 25 to its stop condition. The output of section 25A of flip-flop 25 goes to a low level D.C. voltage thereby disabling NAND gates 33, 43 and 44. The delay in triggering flip-flop 25 achieved by compensation network 28 is accomplished by the width of the pulse emanating from compensation network 28, during the differentiating of the pulse by circuit 30. Since the negative spike pulse is the second pulse out of circuit 30, it may be delayed in time by increasing the width of the pulse from compensation network 28.

Single measurement of time interval

The time interval mode of operation, single measurement, is similar to the time interval mode of operation, repeated measurement, except for the disabling of the NAND gates in the manner as heretofore stated for the single measurement, frequency mode of operation.

Measurement of time

The repeated measurement of time is similar to the repeated measurement of time interval except that instead of being controlled by the events signals from the programmer 1, the "start" and "stop" signals are controlled by the program "start" pulse appearing at terminal 2 and the program "stop" pulse appearing at terminal 4 of programmer 1. Terminal 11 of programmer 1 provides a high level D.C. voltage while terminal 12 provides a low level D.C. voltage.

The negative program start pulse appearing at terminal 2 of programmer 1 is applied to differentiating circuit 23. The negative spike pulse output from differentiating circuit 23 triggers flip-flop 25 causing section 25A to have a high level D.C. output which is applied to differentiating circuit 31. The high level D.C. voltage from section 25A of flip-flop 25 is also applied to NAND gate 33. The positive spike pulses from differentiating circuit 31 trigger monostable multivibrator 35.

The positive pulse output from multivibrator 35 is applied to NAND gate 33. The high level D.C. voltage provided when monostable multivibrator 51 is in the quiescent condition enables the NAND gate 33 along with the output from section 25A of flip-flop 25 so that the pulse from multivibrator 35 is inverted and applied to differentiating circuit 49 by NAND gate 33. The output pulse from NAND gate 33 is also used to reset the various flip-flops and counters as heretofore explained.

The positive and negative spike pulses from differentiating circuit 49 are applied to multivibrator 51. The positive pulse output from multivibrator 51 is applied to differentiating circuit 66. The positive and negative spike pulses from differentiating circuit 66 are applied to one input of NAND gate 86.

The low level D.C. voltage, measurement of time command, at terminal 12 of programmer 1 is applied to inverter 85 through conductor 84. The output from inverter 85 is a high level D.C. voltage which enables NAND gate 86 so that the positive spike pulse from differentiating circuit 66 causes NAND gate 86 to apply a negative pulse to section 62A of flip-flop 62 and to section 55B of flip-flop 55 causing those sections to have high level D.C. voltage outputs. The output from section 62A of flip-flop 62 along with the output of section 55B of flip-flop 55 enables NAND gate 98 so that the timing signal from oscillator 100, which was inverted by inverter 101, is restored to its original polarity by NAND gate 98 and is permitted to enter counter 58.

A negative program stop pulse appearing at terminal 4 of programmer 1 is applied to the compensating network 28. The delayed pulse output from compensating network 28 causes differentiating circuit 30 to yield positive and negative spike pulses. The output from section 25A of flip-flop 25, responding to the negative spike pulse, will go from a high level D.C. voltage to a low level D.C.

voltage. The low level output from section 25A is applied to NOR gate 36 which inverts the voltage to a high level and applies the inverted voltage to NAND gate 136 thereby enabling said gate. The high level D.C. voltage output provided when compensation network 147 is in the quiescent state is applied to NAND gate 136 and causes NAND gate 136 to have a low level D.C. voltage output. Section 62B of flip-flop 62, responding to the output of NAND gate 136, has a high level D.C. voltage output. Normally the high level D.C. voltage output from section 62B of flip-flop 62 triggers oscillator 156, as heretofore explained, and starts the measurement cycle over again. This occurs if a low level D.C. voltage is present at terminal 15 of programmer 1 as heretofore explained. However, with the output voltage from section 25A of flip-flop 25 going to a low level, NAND gate 33 is disabled and prevents the pulse output from monostable multivibrator 35 from triggering flip-flops 55 and 62 to their start conditions.

Events signals appearing on terminal 9 of signal source 1 would have no effect on the measurement of time. Since a high level D.C. voltage is present at terminal 11, the inversion of that voltage by inverter 83 disables NAND gate 78 so that the events signals cannot toggle flip-flop 92. Since flip-flop 92 cannot be toggled, flip-flop 140 is not capable of sending out an inhibit signal which would automatically stop the measurement of time as a function of the events signals.

SUMMARY OF OPERATION

The counter network shown in FIGS. 1 and 2 will operate in an events or frequency mode of operation responding to a program start pulse appearing at terminal 2 of programmer 1 and a low level D.C. command voltage at terminal 5 or terminal 8. During the event or frequency measurement, events signals from the device 19 are applied to the events counter 57 which will count the events signals while oscillator 100 applies timing pulses to interval counter 58. The start of the counting is delayed by a delaying pulse from monostable multivibrator 125, applied to NAND gate 121, until all the necessary flip-flops and gates have been fully enabled. The time base selector 109 selects a time related output from counter 58 that determines the counting period. Upon the termination of the counting period a pulse from selector 109 is applied to the control circuitry which triggers flip-flop 62 to its stop condition resulting in the prevention of the signals from the device being tested from entering events counter 57 and the timing pulses from oscillator 100 from entering interval counter 58 so that events counter 57 contains the number of events signals for a specified time period.

In a repeated measurement mode of operation, the triggering of flip-flop 62 to the stop condition causes oscillator 156 to generate pulses which trigger the measuring sequence over again. A program stop pulse applied by terminal 4 of programmer 1 is necessary to stop the repeated measurement. In the single measurement mode of operation, the control circuitry prevents the pulses from oscillator 156 from starting the measurement sequence over again.

In the time interval mode of operation a program start pulse at terminal 2 and a low level D.C. command voltage at terminal 11 of programmer 1 enables the control circuitry so that a first events signal from the device 19 triggers flip-flops 55 and 62 to their start condition permitting timing pulses from oscillator 100 to enter interval counter 58. An output from interval counter 58, selected by selector 109, is applied to the control circuitry which allows the selected output of interval counter 58 to enter events counter 57. The second events signal triggers flip-flop 92 to the stop condition which triggers flip-flop 140 to its inhibit condition. The inhibit output of flip-flop 140 is delayed by compensation network 147 which provides a delaying pulse to NAND gate 136. Upon termination of the delaying pulse, flip-flop 62 is triggered to its stop condition preventing oscillator 100 timing pulses from entering interval counter 58 and the selective output of selector 109 from entering events counter 57. Events counter 57 contains selected timing pulses indicative of the time between the first events signal and the second events signal and hence of the period of the events signals. When flip-flop 62 was triggered to the stop condition, oscillator 156 was actuated. Depending upon whether a repeated measurement was selected or a single measurement was selected, the pulses from oscillator 156 will or will not start the measurement over again.

In the time mode of operation, a program start pulse present at terminal 2 results in flip-flops 62 and 55 being triggered to their start conditions, thereby allowing timing pulses from oscillator 100 to enter interval counter 58. The output from interval counter 58, as selected by selector 109, is applied to control circuitry and permitted to enter events counter 57. The negative program stop pulse present at terminal 4 of programmer 1 is applied to the control circuitry triggering flip-flop 55 to a stop condition which in turn triggers flip-flop 62 to its stop condition. With flip-flop 62 in its stop condition, the selected output of selector 109 is prevented from entering events counter 57 and the timing pulses from oscillator 100 are prevented from entering interval counter 58. Events counter 57 contains selected timing pulses indicative of the elapsed time between the program start pulse and the program stop pulse.

While several embodiments of the invention have been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A counter network for simultaneously measuring time functions and events comprising timing reference means, an interval counter, a control circuit connecting the timing reference means to the interval counter, an events counter connected to the control circuit, a programmer for providing signals for setting the control circuit to enable the interval counter and events counter to make counts, and means for delaying counter operation at the beginning or end of a count to compensate for inherent delays in the control circuit and including a monostable multivibrator connected to the control circuit and providing a pulse for delaying counter operation.

2. A counter network as defined in claim 1 in which a device being tested is connected by the control circuit to the events counter to provide an event signal.

3. A counter network as defined in claim 2 in which the interval counter provides a plurality of time related outputs and a time base selector is connected to the interval counter and to the programmer and is responsive to the signal from the programmer for selecting a time-related output from the interval counter, means connecting the time base selector to the control circuit, and the control circuit including means responsive to signals from the programmer for blocking event signals from and for applying the selected time-related output to the events counter to provide a timing count.

4. A counter network as defined in claim 3 in which the blocking means includes first and second NAND gates receiving the events signals from the device to be tested and selected time-related output from the interval counter, respectively, and arranged to pass either the signal or output in response to signals from the programmer, and a NOR gate connected to the first and second NAND gates for passing either the events signals or the selected output passed by the NAND gates.

5. A counter network as defined in claim 2 in which the control circuit includes a NAND gate for passing events signals from the device being tested in response to signals from the programmer; and a flip-flop connected to the NAND gate and controlled by the events signals for starting and stopping counting by the counters.

6. A counter network as defined in claim 5 in which the flip-flop starts a count by the counters in response to a first events signal passed by the NAND gate and a second flip-flop connected to the first flip-flop and to the NAND gate stops counting by the counters in response to a second events signal passed by the NAND gate and prevents further counting by the counters in response to subsequent events signals.

7. A counter network as defined in claim 1 in which the interval counter provides a plurality of time-related outputs and a time base selector is connected to the interval counter and to the programmer and is responsive to the signals from the programmer for selecting a time-related output from the interval counter, and means connecting the time base selector to the control circuit for applying the selected output from the interval counter to the control circuit to provide a suitable counting period.

8. A counter network as defined in claim 7 in which the control circuit includes means for passing the time-related output from time base selector in response to signals from the programmer only and means connected to the passing means for stopping counting by the interval and events counters in response to the selected time-related output of the time base selector.

9. A counter network as defined in claim 8 in which the passing means is a NAND gate, and the means for stopping the counting is a flip-flop.

10. A counter network as defined in claim 7 in which the control circuit includes a first NAND gate for blocking or passing to the events counter measurement signals from the device being tested or a selected output from the time base selector, a second NAND gate for blocking or passing a timing signal from the timing reference means to the interval counter; and a flip-flop connected to both NAND gates and responsive to signals from the programmer for enabling both NAND gates to pass signals simultaneously to the interval counter and the events counter.

11. A counter network as defined in claim 1 wherein the timing reference means is an oscillator for providing timing pulses.

12. A counter network as defined in claim 1 in which the timing reference means is an oscillator for providing timing pulses for the interval counter in providing a plurality of time-related outputs and a time base selector is connected to the interval counter and to the programmer and is responsive to the signals from the programmer for selecting a time-related output from the interval counter and means connecting the time base selector to the control circuit for applying the selected output to the control circuit to provide a suitable counting period.

13. A counter network as defined in claim 1 in which the timing reference means is an oscillator for providing timing pulses for the interval counter in providing a plurality of time-related outputs and a time base selector is connected to the interval counter and to the programmer and is responsive to the signals from the programmer for selecting a time-related output from the interval counter and means connecting the time base selector through the control circuit to the events counter to provide a timing count.

14. A counter network as defined in claim 1 wherein the control circuit includes means responsive to a signal from the programmer for actuating the multivibrator for providing the delaying pulse.

15. A counter network as defined in claim 1 wherein the control circuit includes means responsive to a signal from the device being tested for actuating the multivibrator for providing the delaying pulse.

16. A counter network as defined in claim 1 wherein the control circuit includes means responsive to completion of a preceding count for actuating the multivibrator for providing the delaying pulse.

17. A counter network as defined in claim 1 which automatically initiates a new count, the control circuit including a flip-flop for starting and stopping a count, the flip-flop being controlled by the interval counter, the programmer, or the device being tested to stop a count; a one-shot multivibrator providing pulses for controlling the flip-flop to start a count; a NAND gate controlled by the programmer for controlling the multivibrator; and an oscillator controlled by the flip-flop and connected to the NAND gate for providing pulses to the multivibrator for automatically initiating a new count.

18. A counter network as defined in claim 1 in which the control circuit includes means for sharpening a control pulse to eliminate inherent variations in response time resulting from a non-sharpened pulse, comprising a NAND gate, a first monostable multivibrator connected to the NAND gate and responsive to signals from the programmer for providing a control pulse to the NAND gate, and a second monostable multivibrator having an input connected to the output of the NAND gate and an output connected to the input of the NAND gate for providing a disabling pulse to the NAND gate in response to the leading edge of the first pulse causing the NAND gate to block the remainder of the control pulse to sharpen the control pulse and eliminate inherent variations in response time.

References Cited

UNITED STATES PATENTS 3,082,374 3/1963 Buuck ------------ 324—68(C)

OTHER REFERENCES

Sandia Corp. Tech. Memo.: "One-Hundred k.c. Trans. Programmable Elec. Counter-Timer," April, 1961; pp. 1 and 5–11.

ALFRED E. SMITH, Primary Examiner

U.S. Cl. X.R.

324—78